United States Patent
Lee et al.

(10) Patent No.: US 7,817,461 B2
(45) Date of Patent: Oct. 19, 2010

(54) DATA STORAGE DEVICE USING MAGNETIC DOMAIN WALL MOVEMENT AND METHOD OF OPERATING THE SAME

(75) Inventors: Sung-chul Lee, Yongin-si (KR); Sung-hoon Choa, Yongin-si (KR); Yong-su Kim, Yongin-si (KR)

(73) Assignee: Samsung Electronics Co., Ltd, Gyeonggi-Do (KR)

( * ) Notice: Subject to any disclaimer, the term of this patent is extended or adjusted under 35 U.S.C. 154(b) by 818 days.

(21) Appl. No.: 11/752,397

(22) Filed: May 23, 2007

(65) Prior Publication Data

US 2008/0094760 A1 Apr. 24, 2008

(30) Foreign Application Priority Data

Oct. 27, 2006 (KR) .................. 10-2006-0105272

(51) Int. Cl.
*G11C 11/00* (2006.01)

(52) U.S. Cl. .................. 365/158; 365/80; 365/171; 365/189.011; 257/421

(58) Field of Classification Search .............. 365/158, 365/80, 171, 189.011; 257/421
See application file for complete search history.

(56) References Cited

U.S. PATENT DOCUMENTS

| 6,898,132 B2 * | 5/2005 | Parkin .............. 365/189.12 |
| 7,236,386 B2 * | 6/2007 | Parkin .............. 365/80 |
| 7,416,905 B2 * | 8/2008 | Chen et al. .............. 438/3 |
| 2007/0278603 A1 * | 12/2007 | Ochiai et al. .............. 257/421 |

* cited by examiner

*Primary Examiner*—Anh Phung
*Assistant Examiner*—Toan Le
(74) *Attorney, Agent, or Firm*—Harness, Dickey & Pierce, P.L.C.

(57) ABSTRACT

Provided are a data storage device using a magnetic domain wall movement and a method of operating the data storage device. The data storage device includes a magnetic layer including a plurality of magnetic domains, first and second ferromagnetic pinned layers formed on lower and upper surfaces of the magnetic layer, respectively, and having opposite magnetization directions, first and second insulating spacers interposed between the first and second ferromagnetic pinned layers and the magnetic layer, respectively, and an energy supplying unit applying energy to the magnetic layer for a magnetic domain wall movement.

12 Claims, 4 Drawing Sheets

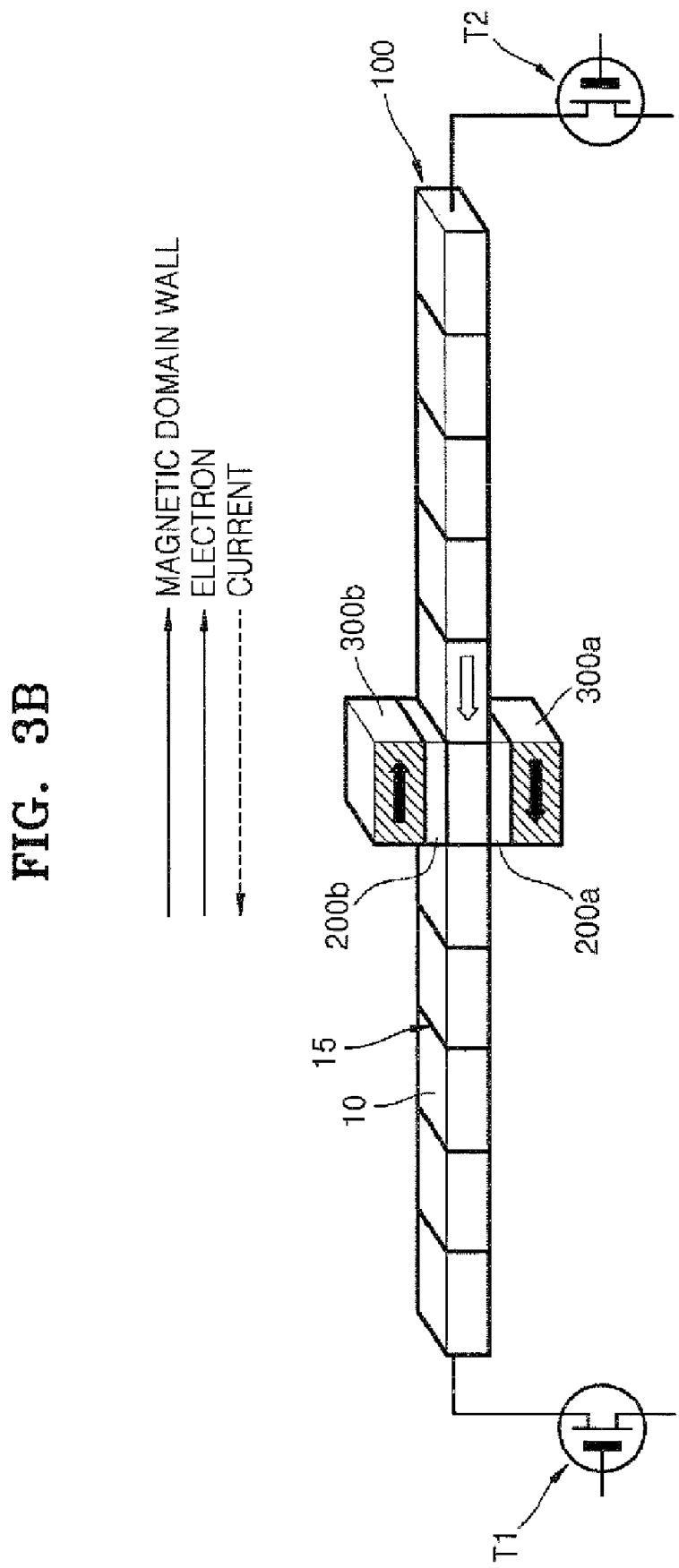

DATA STORAGE DEVICE USING MAGNETIC DOMAIN WALL MOVEMENT AND METHOD OF OPERATING THE SAME

CROSS-REFERENCE TO RELATED PATENT APPLICATION

This application claims the benefit of Korean Patent Application No. 10-2006-0105272, filed on Oct. 27, 2006, in the Korean Intellectual Property Office, the disclosure of which is incorporated herein in its entirety by reference.

BACKGROUND OF THE INVENTION

1. Field of the Invention

The present invention relates to a data storage device, and more particularly, to a data storage device using a magnetic domain wall movement of a magnetic material and a method of operating the data storage device.

2. Description of the Related Art

A minute magnetic region that constitutes a ferromagnetic body is referred to as a magnetic domain. The rotation of electrons in a magnetic domain, that is, the direction of a magnetic moment is identical. The size and magnetization direction can be appropriately controlled by the shape and size of a magnetic substance and external energy.

A magnetic domain wall is a region which separates magnetic domains each having a magnetization direction different from another magnetic domain. The magnetic domain wall can be moved or propagated by an external magnetic field or by a current applied to a magnetic substance. That is, a plurality of magnetic domains having a specific magnetization direction can be formed in a magnetic layer having a predetermined width and thickness, and the magnetic domains can be moved using a magnetic field or a current having an appropriate strength.

The principle of the magnetic domain wall movement can be applied to data storage devices. For example, when magnetic domains pass through a read/write head by a magnetic domain wall movement, an operation of reading/writing data is possible without rotating a recording medium. Since data storage devices using a magnetic domain wall movement have relatively simple structures and small bit sizes to realize highly integration, a very large storage capacity more than 1 Tbit/in$^2$ can be achieved.

However, since such data storage devices are in the early stage of development, several problems should be solved so that the data storage devices may be put to practical use. One of the several problems is that a high current is required for writing. That is, a high current is required in order to reverse the magnetization direction of the magnetic domain.

In addition, a current may disadvantageously leak from the magnetic layer to a write/read head. When a current is applied to the magnetic layer for the magnetic domain wall movement, since the current may partially leak leading to high power consumption, the magnetic domain wall movement may not be smooth.

Accordingly, in order to use data storage device using the magnetic domain wall movement, a writing current density should be remarkably reduced, and a current should not leak to the write/read head.

SUMMARY OF THE INVENTION

The present invention provides a data storage device using a magnetic domain wall movement in which a writing current density is reduced and a current leakage to a write/read head is restrained.

The present invention also provides a method of operating the data storage device.

According to an aspect of the present invention, there is provided a data storage device using a magnetic domain wall movement, including: a magnetic layer including a plurality of magnetic domains; a first ferromagnetic pinned layer formed on a lower surface of the magnetic layer; a second ferromagnetic pinned layer formed on a upper surface of the magnetic layer, wherein the first and the second ferromagnetic pinned layers have opposite magnetization directions; a first insulating spacer interposed between the first ferromagnetic pinned layer and the magnetic layer; a second insulating spacer interposed between the second ferromagnetic pinned layer and the magnetic layer; and an energy supplying unit applying energy to the magnetic layer for a magnetic domain wall movement.

The first and second ferromagnetic pinned layers are disposed on a portion of the respective lower and upper surfaces of the magnetic layer, the portion of the lower surface being corresponding to the portion of the upper surface.

The first and second insulating spacers may be an oxide layer.

The energy for the magnetic domain wall movement may be a current or a magnetic field.

At least one of both ends of the magnetic layer may be connected to the energy supplying unit.

The energy supplying unit may be a transistor.

An anti-ferromagnetic layer may be formed on a lower surface of the first ferromagnetic pinned layer.

An anti-ferromagnetic layer may be formed on an upper surface of the second ferromagnetic pinned layer.

The data storage device may further comprises a laminate of a conductive spacer, a ferromagnetic pinned layer, and an anti-ferromagnetic layer, wherein the laminate is formed on a surface the first ferromagnetic pinned layer and/or the second ferromagnetic pinned layer in such a way that each of the first and the second ferromagnetic pinned layers is interposed between the laminate and the magnetic layer; and wherein the ferromagnetic pinned layer of the laminate has an opposite magnetization direction to a magnetization direction of the first ferromagnetic pinned layer or the second ferromagnetic pinned layer.

According to another aspect of the present invention, there is provided a method of writing data onto a data storage device, which comprises: applying a writing voltage to the data storage device, the data storage device comprising: a magnetic layer including a plurality of magnetic domains and a magnetic domain wall present at a boundary of neighboring domains; a first ferromagnetic pinned layer formed on a lower surface of the magnetic layer; a second ferromagnetic pinned layer formed on a upper surface of the magnetic layer, the upper surface being opposite to the lower surface, wherein the first and second ferromagnetic pinned layers have opposite magnetization directions; a first insulating spacer interposed between the first ferromagnetic pinned layer and the magnetic layer; a second insulating spacer interposed between the second ferromagnetic pinned layer an the magnetic layer; and an energy supplying unit which applies energy to the magnetic layer to move the magnetic domain wall in the magnetic layer, wherein the writing voltage is applied between the first ferromagnetic pinned layer and the second ferromagnetic pinned layer to write data in the magnetic layer, and moving the magnetic domain wall of the magnetic layer by one bit.

According to another aspect of the present invention, there is provided a method of reading data in a data storage device, which comprises: measuring an electric resistance existing in the data storage device, the data storage device comprising: a magnetic layer including a plurality of magnetic domains and a magnetic domain wall present at a boundary of neighboring domains; a first ferromagnetic pinned layer formed on a lower surface of the magnetic layer; a second ferromagnetic pinned layer formed on a upper surface of the magnetic layer, the upper surface being opposite to the lower surface, wherein the first and second ferromagnetic pinned layers have opposite magnetization directions; a first insulating spacer interposed between the first ferromagnetic pinned layer and the magnetic layer; a second insulating spacer interposed between the second ferromagnetic pinned layer an the magnetic layer; and an energy supplying unit which applies energy to the magnetic layer to move the magnetic domain wall in the magnetic layer, wherein the electric resistance to be measured exists (i) between the first ferromagnetic pinned layer and one end of the magnetic layer, (ii) between the first ferromagnetic pinned layer and the other end of the magnetic layer, (iii) between the second ferromagnetic pinned layer and one end of the magnetic layer, (iv) between the second ferromagnetic pinned layer and the other end of the magnetic layer; and moving the magnetic domain wall of the magnetic layer by one bit.

BRIEF DESCRIPTION OF THE DRAWINGS

The above and other features and advantages of the present invention will become more apparent by describing in detail exemplary embodiments thereof with reference to the attached drawings in which:

FIGS. 3A and 3B are cross-sectional views illustrating a writing operation of the data storage device of FIG. 1, according to an embodiment of the present invention.

DETAILED DESCRIPTION OF THE INVENTION

Figure 1:
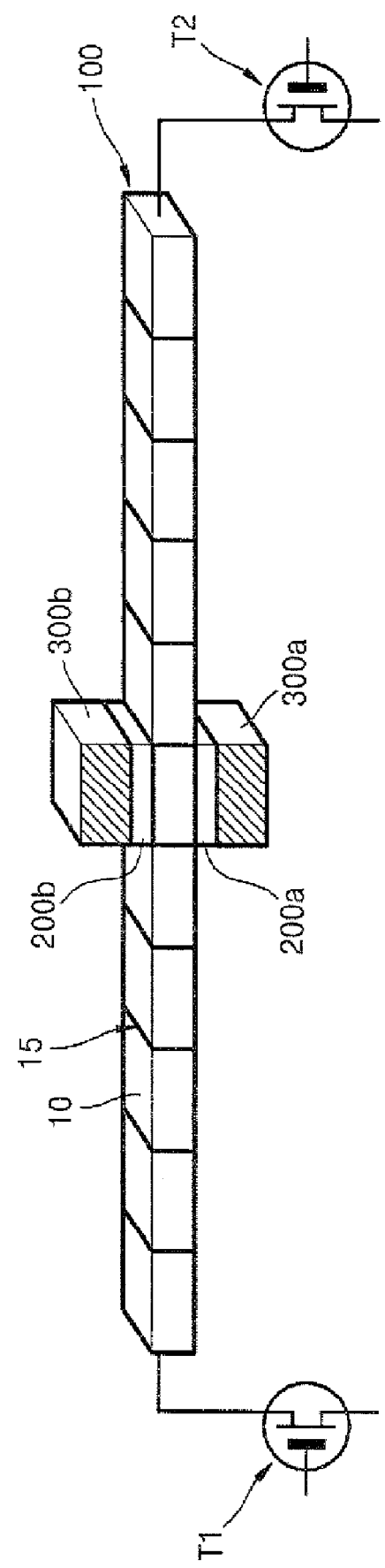
FIG. 1 is a schematic perspective view of a data storage device using a magnetic domain wall movement, according to an embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thickness of layers and region are exaggerated for clarity.

FIG. 1 is a schematic perspective view of a data storage device using a magnetic domain wall movement, according to an embodiment of the present invention.

Referring to FIG. 1, the data storage device using the magnetic domain wall movement according to the current embodiment of the present invention (hereinafter, referred to as 'data storage device of the present invention') includes a magnetic layer 100 including a plurality of magnetic domains 10. A notch may be formed on the magnetic layer 100 in order to improve the stability of the magnetic domain wall movement. The notch is formed so as to define the magnetic domains 10 functioning as bit sizes. Reference number 15 represents the magnetic domain walls.

First and second ferromagnetic pinned layers 300a and 300b having opposite magnetization directions are formed on lower and upper surfaces of a region corresponding to a unit bit of the magnetic layer 100, respectively. It should be noted that the terms "lower" and "upper" are used herein to indicate that a surface of a layer faces south or north in the drawings, but not necessarily upper or lower part of a device. A pinned layer is a ferromagnetic layer having a fixed magnetization direction. First and second insulating spacers 200a and 200b are interposed between first ferromagnetic pinned layer 300a and the magnetic layer 100 and between second ferromagnetic pinned layer 300b and the magnetic layer 100, respectively. The first and second insulating spacers 200a and 200b may be an oxide layer formed of MgO. In addition, the first and second insulating spacers 200a and 200b may be formed to have a small thickness so that an electron tunneling effect may occur through the first and second insulating spacers 200a and 200b. Even though detailed descriptions will be described later, a writing current is applied between the first and second ferromagnetic pinned layers 300a and 300b, and a reading current is applied (i) between the first ferromagnetic pinned layer 300a and one end of the magnetic layer, (ii) between the first ferromagnetic pinned layer 300a and the other end of the magnetic layer, (iii) between the second ferromagnetic pinned layer 300b and one end of the magnetic layer, or (iv) between the second ferromagnetic pinned layer 300b and the other end of the magnetic layer.

At least one of both ends of the magnetic layer 100 may be connected to a driving element for moving the magnetic domain walls 15. For example, the ends of the magnetic layer 100 are each connected to the first and second transistors T1 and T2, respectively, as illustrated in FIG. 1. A current direction is determined according to on/off states of the first and second transistors T1 and T2. The magnetic domain walls 15 move in an opposite direction to that of the current, that is, a direction of an electron. Energy applied to the magnetic layer 100 for moving the magnetic domain walls 15 may be a magnetic field instead of a current. Various types of an energy supplying unit may be used.

Although not illustrated in FIG. 1, layers are formed on a lower surface of the first ferromagnetic pinned layer 300a (i.e., a surface which is opposite to the surface where the first ferromagnetic pinned layer is in contact with the insulating spacer 200a) and an upper surface of the second ferromagnetic pinned layer 300b (i.e., a surface which is opposite to the surface where the second ferromagnetic pinned layer is in contact with the insulating spacer 200b) in order to fix the magnetization directions of the first and second ferromagnetic pinned layers 300a and 300b, respectively. Each of the layers fixing the magnetization direction of the first and second ferromagnetic pinned layers 300a and 300b may be a single layer such as an anti-ferromagnetic layer, or a laminate of multiple layers including a conductive spacer, and a ferromagnetic pinned layer and an anti-ferromagnetic layer that are sequentially stacked. When a laminate of plural layers is used to fix the magnetization direction of the first ferromagnetic pinned layer 300a, a first conductive spacer, a third ferromagnetic pinned layer having opposite magnetization direction to that of the first ferromagnetic pinned layer 300a, and a first anti-ferromagnetic layer are sequentially formed on the lower surface of the first ferromagnetic pinned layer 300a. Simultaneously, a second conductive spacer, a fourth ferromagnetic pinned layer having opposite magnetization direction to that of the second ferromagnetic pinned layer 300b, and a second anti-ferromagnetic layer may be sequentially formed on the upper surface of the second ferromagnetic pinned layer 300b.

Hereinafter, the writing principle of the data storage device according to the present invention will be described.

Figure 2A:
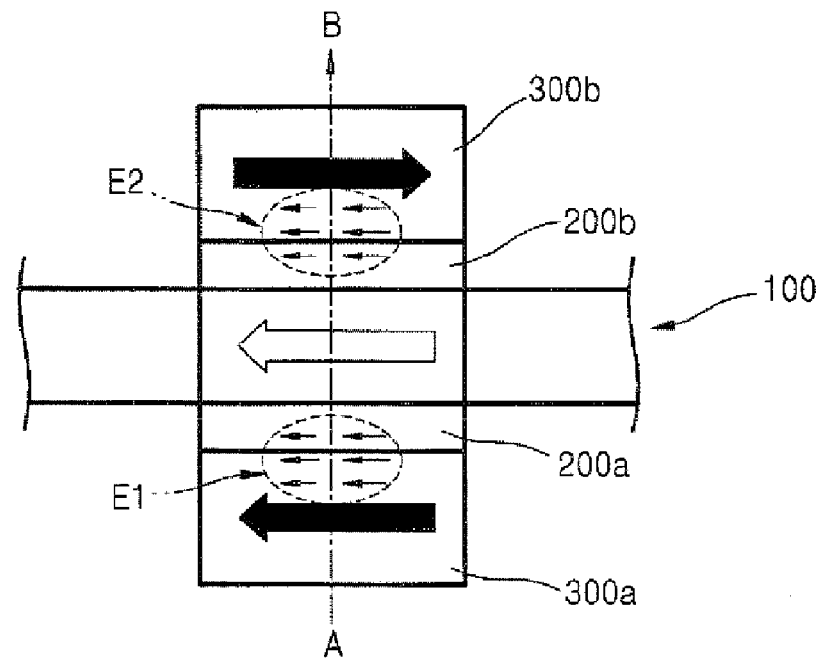
FIGS. 2A and 2B are schematic views illustrating the writing principle of the data storage device according to an embodiment of the present invention.
Figure 2B:
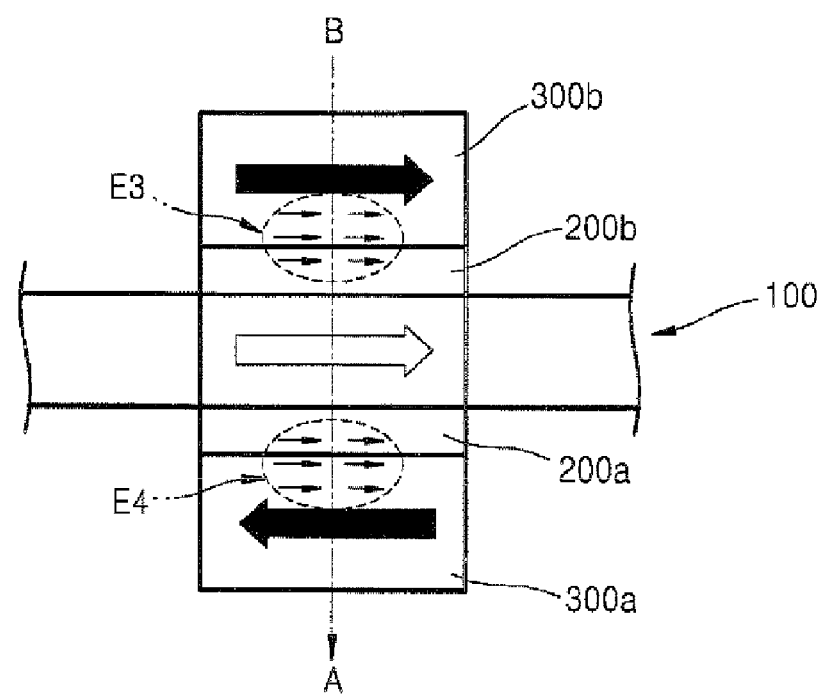

FIGS. 2A and 2B are schematic views illustrating the writing principle of the data storage device according to the present invention. Like reference numerals in FIGS. 1, 2A, and 2B denote like elements.

Referring to FIG. 2A, when an electron moves from a first ferromagnetic pinned layer 300a to a second ferromagnetic pinned layer 300b, that is, from A to B, electrons E1 having the same magnetization direction (hereinafter referred to as 'first direction') as that of the first ferromagnetic pinned layer 300a move to a magnetic layer 100. The electrons E1 magnetize the magnetic layer 100 in the first direction determined by a spin transfer torque effect.

Meanwhile, electrons having the same magnetization direction (hereinafter referred to as 'second direction') as that of a second ferromagnetic pinned layer 300b go out of the second ferromagnetic pinned layer 300b. However, electrons E2 having opposite magnetization direction to that of the second ferromagnetic pinned layer 300b do not go out of the second ferromagnetic pinned layer 300b, but return to the magnetic layer 100 to pile up. The electrons E2 magnetize the magnetic layer 100 in the first direction determined by a spin accumulation effect.

As described above, first data is recorded in the magnetic layer 100 according to the spin transfer torque effect and the spin accumulation effect.

Referring to FIG. 2B, when an electron moves from the second ferromagnetic pinned layer 300b to the first ferromagnetic pinned layer 300a, that is, from B to A, electrons E3 magnetized in the second direction move to the magnetic layer 100. The electrons E3 magnetize the magnetic layer 100 in the second direction. Meanwhile, electrons in the first ferromagnetic pinned layer 330a which are magnetized in the first direction go out of the first ferromagnetic pinned layer 300a. However, the electrons E4 magnetized in the second direction do not go out of the first ferromagnetic pinned layer 300a, but return to the magnetic layer 100 to pile up. The electrons E4 magnetize the magnetic layer 100 in the second direction. Accordingly, second data is recorded in the magnetic layer 100.

As described above, since the first and second ferromagnetic pinned layers 300a and 300b, which are magnetized in opposite directions to each other, are each formed on the lower and the upper surfaces of the magnetic layer 100, respectively, a writing operation is performed by the spin transfer torque effect and the spin accumulation effect. Accordingly, the data storage device of the present invention can remarkably reduce a writing current density as compared with the case of using one pinned layer.

The data storage device of the present invention is operated as follows.

<Writing Operation>

Figure 3A:
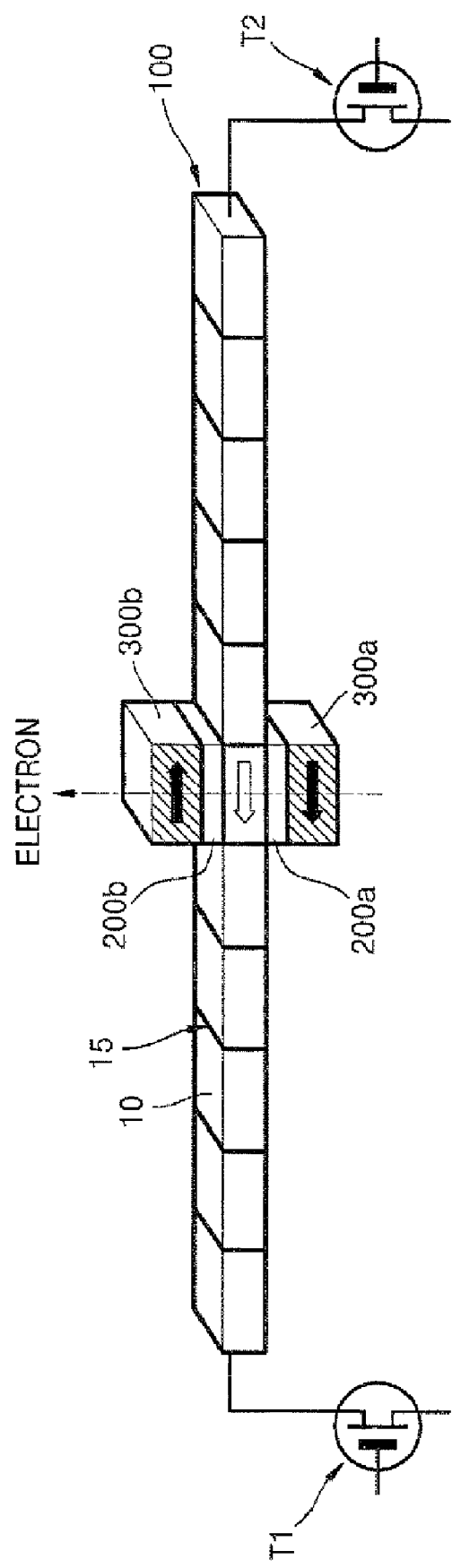

FIGS. 3A and 3B are cross-sectional views illustrating a writing operation of the data storage device of the present invention of FIG. 1, according to an embodiment of the present invention.

The writing operation of the data storage device of the present invention includes applying a writing voltage between the first ferromagnetic pinned layer 300a and the second ferromagnetic pinned layer 300b to write data in the magnetic layer 100 as illustrated in FIG. 3A, and moving the magnetic domain walls 15 of the magnetic layer 100 by one bit as illustrated in FIG. 3B.

In the operation of FIG. 3A, a type of recorded data is determined according to the direction of current passing between the first ferromagnetic pinned layer 300a and the second ferromagnetic pinned layer 300b. In the operation of FIG. 3B, a pulse current is applied to the magnetic layer 100 according to on/off state of the first and second transistors T1 and T2. The movement direction of the magnetic domain walls 15 is determined according to the direction of the pulse current passing between both ends of the magnetic layer 100. As described above, the magnetic domain walls 15 move in the same direction as that of an electron. By alternately repeating the operations of FIGS. 3A and 3B, a large amount of data can be recorded in the magnetic layer 100.

<Reading Operation>

The reading operation of the data storage device of the present invention of FIG. 1 includes measuring an electric resistance between any one of the first ferromagnetic pinned layer 300a and second ferromagnetic pinned layer 300b and any one end of the magnetic layer 100 to read data recorded in the magnetic layer 100, and moving the magnetic domain walls 15 of the magnetic layer 100 by one bit. The measuring operation and the moving operation may be alternatively repeated. The measuring operation uses a principle in which the electric resistance may be altered according to the type of data recorded in the magnetic layer 100. The moving operation is the same as that of the writing operation.

In the moving operation step of the writing operation and the reading operation, a current is applied to the magnetic layer 100 for the movement of the magnetic domain walls 15. Here, the first and second insulating spacers 200a and 200b function as electric barriers. Thus, the current for the movement of the magnetic domain walls 15 does not leak to the first and second ferromagnetic pinned layers 300a and 300b.

According to the current embodiment of the present invention, the magnetization direction of the magnetic domains 10 is parallel to the magnetic layer 100. However, the principle used in the present invention may be also used in the case where the magnetization direction of the magnetic domains 10 is perpendicular to the magnetic layer 100. In addition, according to the current embodiment of the present invention, the magnetic layer 100 is parallel to a substrate (not shown). The principle used in the present invention may be also used in the case where the magnetic layer 100 is perpendicular to the substrate.

As described above, in the data storage device of the present invention, since the first and second ferromagnetic pinned layers 300a and 300b having opposite magnetization directions are each formed on the respective one of opposite faces of the magnetic layer 100, the writing operation is performed by the spin transfer torque effect and spin accumulation effect. Accordingly, the writing current density is remarkably reduced.

In addition, in the data storage device of the present invention, when a current is applied to the magnetic layer 100 for the movement of the magnetic domain walls 15, the first and second insulating spacers 200a and 200b function as electric barriers, the current for the magnetic domain wall movement is prevented from leaking. Accordingly, the magnetic domain wall movement by the current may be performed smoothly.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A data storage device, comprising:
a magnetic layer including a plurality of magnetic domains and a magnetic domain wall present at a boundary of neighboring domains;
a first ferromagnetic pinned layer formed on a lower surface of the magnetic layer;

a second ferromagnetic pinned layer formed on a upper surface of the magnetic layer, the upper surface being opposite to the lower surface, wherein the first and second ferromagnetic pinned layers have opposite magnetization directions;

a first insulating spacer interposed between the first ferromagnetic pinned layer and the magnetic layer;

a second insulating spacer interposed between the second ferromagnetic pinned layer and the magnetic layer; and an energy supplying unit which applies energy to the magnetic layer to move the magnetic domain wall in the magnetic layer.

2. The data storage device of claim 1, wherein the first and second ferromagnetic pinned layers are disposed on a portion of the respective lower and upper surfaces of the magnetic layer, the portion of the lower surface being corresponding to the portion of the upper surface.

3. The data storage device of claim 1, wherein the first and second insulating spacers are an oxide layer.

4. The data storage device of claim 1, wherein the energy to move the magnetic domain wall is a current or a magnetic field.

5. The data storage device of claim 1, wherein the magnetic layer has two ends, at least one of which are connected to the energy supplying unit.

6. The data storage device of claim 5, wherein the energy supplying unit is a transistor.

7. The data storage device of claim 1, further comprising an anti-ferromagnetic layer, which is formed on a surface the first ferromagnetic pinned layer and/or the second ferromagnetic pinned layer in such a way that each of the first and the second ferromagnetic pinned layers is interposed between the anti-ferromagnetic layer and the magnetic layer.

8. The data storage device of claim 7, wherein the anti-ferromagnetic layer is formed on the first ferromagnetic pinned layer and on the second ferromagnetic pinned layer.

9. The data storage device of claim 1, further comprising:
a laminate of a conductive spacer, a ferromagnetic pinned layer, and an anti-ferromagnetic layer, wherein the laminate is formed on a surface the first ferromagnetic pinned layer and/or the second ferromagnetic pinned layer in such a way that each of the first and the second ferromagnetic pinned layers is interposed between the laminate and the magnetic layer; and wherein the ferromagnetic pinned layer of the laminate has an opposite magnetization direction to a magnetization direction of the first ferromagnetic pinned layer or the second ferromagnetic pinned layer.

10. The data storage device of claim 9, wherein the laminate is formed on the first ferromagnetic pinned layer and on the second ferromagnetic pinned layer.

11. A method of writing data onto a data storage device, which comprises:
applying a writing voltage to the data storage device, the data storage device comprising:

a magnetic layer including a plurality of magnetic domains and a magnetic domain wall present at a boundary of neighboring domains;

a first ferromagnetic pinned layer formed on a lower surface of the magnetic layer;

a second ferromagnetic pinned layer formed on a upper surface of the magnetic layer, the upper surface being opposite to the lower surface, wherein the first and second ferromagnetic pinned layers have opposite magnetization directions;

a first insulating spacer interposed between the first ferromagnetic pinned layer and the magnetic layer;

a second insulating spacer interposed between the second ferromagnetic pinned layer and the magnetic layer; and an energy supplying unit which applies energy to the magnetic layer to move the magnetic domain wall in the magnetic layer, wherein the writing voltage is applied between the first ferromagnetic pinned layer and the second ferromagnetic pinned layer to write data in the magnetic layer; and moving the magnetic domain wall of the magnetic layer by one bit.

12. A method of reading data in a data storage device, which comprises:
measuring an electric resistance existing in the data storage device, the data storage device comprising:

a magnetic layer including a plurality of magnetic domains and a magnetic domain wall present at a boundary of neighboring domains;

a first ferromagnetic pinned layer formed on a lower surface of the magnetic layer;

a second ferromagnetic pinned layer formed on a upper surface of the magnetic layer, the upper surface being opposite to the lower surface, wherein the first and second ferromagnetic pinned layers have opposite magnetization directions;

a first insulating spacer interposed between the first ferromagnetic pinned layer and the magnetic layer;

a second insulating spacer interposed between the second ferromagnetic pinned layer and the magnetic layer; and an energy supplying unit which applies energy to the magnetic layer to move the magnetic domain wall in the magnetic layer, wherein the electric resistance to be measured exists (i) between the first ferromagnetic pinned layer and one end of the magnetic layer, (ii) between the first ferromagnetic pinned layer and the other end of the magnetic layer, (iii) between the second ferromagnetic pinned layer and one end of the magnetic layer, (vi) between the second ferromagnetic pinned layer and the other end of the magnetic layer; and moving the magnetic domain wall of the magnetic layer by one bit.

* * * * *